United States Patent
Chen et al.

(10) Patent No.: US 9,159,434 B2
(45) Date of Patent: Oct. 13, 2015

(54) BIT LINE BIAS CIRCUIT WITH VARYING VOLTAGE DROP

(75) Inventors: Chung-Kuang Chen, Hsinchu (TW); Han-Sung Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 750 days.

(21) Appl. No.: 13/458,485

(22) Filed: Apr. 27, 2012

(65) Prior Publication Data

US 2013/0286744 A1    Oct. 31, 2013

(51) Int. Cl.
| | |
|---|---|
| G11C 16/06 | (2006.01) |
| G11C 11/34 | (2006.01) |
| G11C 16/26 | (2006.01) |
| G11C 7/06 | (2006.01) |
| G11C 16/24 | (2006.01) |
| G11C 7/12 | (2006.01) |

(52) U.S. Cl.
CPC .................. *G11C 16/26* (2013.01); *G11C 7/06* (2013.01); *G11C 7/065* (2013.01); *G11C 7/12* (2013.01); *G11C 16/24* (2013.01)

(58) Field of Classification Search
CPC .............. G11C 16/0483; G11C 16/10; G11C 16/3427; G11C 16/08; G11C 11/5628; G11C 16/28; G11C 16/06; G11C 16/16; G11C 16/32; G11C 8/08; G11C 8/10
USPC ............... 365/89.03, 189.14, 189.06, 189.09, 365/189.08, 205, 207, 230.05, 230.06, 365/185.02, 185.11, 185.17, 185.18, 365/185.23, 185.24, 185.29, 185.21
See application file for complete search history.

(56) References Cited

U.S. PATENT DOCUMENTS

| | | | |
|---|---|---|---|
| 7,177,181 | B1 | 2/2007 | Scheuerlein |
| 7,542,338 | B2 | 6/2009 | Scheuerlein et al. |
| 8,169,830 | B2 | 5/2012 | Moschiano et al. |
| 2010/0118605 | A1 | 5/2010 | Shibata et al. |
| 2011/0063920 | A1 | 3/2011 | Moschiano et al. |

OTHER PUBLICATIONS

Taiwanese Office Action mailed Apr. 21, 2015 for Application No. 101120949.

*Primary Examiner* — Hien Nguyen
(74) *Attorney, Agent, or Firm* — Kenta Suzue; Haynes Beffel & Wolfeld LLP

(57) ABSTRACT

A bit line bias circuit of a memory architecture includes a varying voltage drop. In some embodiments, the voltage drop can depend on the threshold voltage of the memory cell selected to be read, or on the sense current flowing through the memory cell selected to be read.

24 Claims, 8 Drawing Sheets

BIT LINE BIAS CIRCUIT WITH VARYING VOLTAGE DROP

BACKGROUND OF THE INVENTION

1. Field of the Invention

The present invention relates to a bias circuit for a bit line of a memory array in an integrated circuit.

2. Description of Related Art

In an operation to ascertain the contents of a memory cell, a bit line bias circuit applies a bias to a bit line of a memory array, and a word line applies a bias to a selected memory cell of a memory array. A sense current results between the bit line and a reference line on opposite sides of the memory cell, flowing through the memory cell with a magnitude depending on the data stored by the memory cell as represented by a threshold voltage of the memory cell.

However, the reference line, often referred to as a source line, is not an ideal reference line. The reference line has some finite resistance rather than zero resistance. The finite resistance causes an unwanted voltage difference between the intended reference voltage such as zero volts or ground, and the source of a memory cell. During a sensing operation, the word line bias is reduced in effect, as the voltage difference between the word line and the reference line is reduced. As a result, the result of sensing may be wrong. This effect becomes worse with increasing current, because the unwanted voltage difference is proportional to sense current ($V=I*R$). Larger scale integration worsens this problem, as larger numbers of bit lines—that can each contribute current to the reference line—are coupled to the same reference line.

One approach to this approach is multi-pass sensing, in which sensing in limited to only a subset of memory cells in the array that draw a current larger than a threshold current. In subsequent sensing passes, previously sensed cells are turned off. Due to the increased time of performing multiple passes, it would be desirable to eliminate multiple passes, or at least to reduce the number of sensing passes.

SUMMARY OF THE INVENTION

The technology described here includes an integrated circuit with a memory array and a bias circuit. The memory cells of the memory array have a threshold voltage within one of a plurality of threshold voltage ranges representing data values storable in the memory cells. The memory cells have a drain side and a source side. In some embodiments, the drain side has a higher voltage than the source side during at least part of a sensing operation for the threshold voltage.

The bias circuit applies a bias to the drain side of a selected memory cell of the memory array during sensing of the threshold voltage of the selected memory cell. The bias circuit includes a circuit element electrically coupled in series with the selected memory cell of the memory array. In some embodiments, the circuit element has a varying voltage drop that depends on the threshold voltage of the selected memory cell.

In some embodiments, the varying voltage drop has a first voltage drop responsive to the threshold voltage of the selected memory cell being in a first threshold voltage range, and a second voltage drop with a magnitude lower than the first voltage drop responsive to the threshold voltage of the selected memory cell being in a second threshold voltage range higher than the first threshold voltage range. The first threshold voltage range can correspond to a low Vt distribution, and the second threshold voltage range can correspond to a high Vt distribution.

In some embodiments of the described technology, the varying voltage drop increases with a decreasing magnitude of the threshold voltage of the selected memory cell. For example, a low threshold voltage memory cell will result in the varying voltage drop having a high voltage drop, and a high threshold voltage memory cell will result in the varying voltage drop having a low voltage drop. Although low threshold voltage memory cells are associated with large sense currents, these sense currents will be decreased to reduce unwanted voltages at the reference line or source line.

In some embodiments of the described technology, the varying voltage drop increases with an increasing magnitude of a sense current flowing through the selected memory cell and the circuit element, during sensing of the threshold voltage of the selected memory cell. Because the voltage drop is higher for larger sense currents, the magnitude of sense currents will tend to decrease. Decreased sense currents will reduce unwanted voltages at the reference line or source line.

In some embodiments of the described technology, the circuit element has a varying resistance equal to a voltage across first and second terminals of the circuit element divided by a sense current through the first and second terminals of the circuit element during sensing of the threshold voltage of the selected memory cell.

Some embodiments of the described technology include control circuitry coupled to the memory array. The control circuitry is responsive to an instruction to read the selected memory cell, by causing the bias circuit to apply the bias to the drain side of the selected memory cell.

In some embodiments of the described technology, the circuit element is a transistor. The transistor has a first current carrying terminal, a second current carrying terminal, and a control terminal, wherein the first current carrying terminal and the second current carrying terminal are electrically coupled in series with the selected memory cell. The transistor has current-voltage operation modes including a linear mode and a saturation mode, and the varying voltage drop of the transistor increases as the transistor is biased further into the saturation mode and further away from the linear mode.

Some embodiments of the described technology include sense circuitry coupled to the bias circuit that identifies a threshold voltage range of the plurality of threshold voltage ranges that includes the threshold voltage of the selected memory cell. For example, the sense circuitry identifies whether the threshold voltage of the selected memory cell is in a high threshold voltage range or a low threshold voltage range that represent different data values.

Additional technology is described here of an integrated circuit with a memory array and a bias circuit. The memory cells of the memory array have a threshold voltage within one of a plurality of threshold voltage ranges representing data values storable in the memory cells. The circuit element has a varying voltage drop that depends on a sense current flowing through a selected memory cell of the memory array and the circuit element. The sense current depends on the threshold voltage of the selected memory cell.

In some embodiments, The varying voltage drop has a first voltage drop responsive to the threshold voltage of the selected memory cell being in a first threshold voltage range, and a second resistance lower than the first resistance responsive to the threshold voltage of the selected memory cell being in a second threshold voltage range higher than the first threshold voltage range. The first threshold voltage range can correspond to a low Vt distribution, and the second threshold voltage range can correspond to a high Vt distribution.

Further technology is described here of an integrated circuit with a memory array and a bias circuit. The memory cells of the memory array have a threshold voltage within one of a plurality of threshold voltage ranges representing data values storable in the memory cells. The memory cells have a drain side and a source side. In some embodiments, the drain side of the memory cells have a higher voltage than the source side of the memory cells during sensing of the threshold voltage.

The bias circuit has an output voltage that applies a bias to the drain side of a selected memory cell of the memory array during sensing of the threshold voltage of the selected memory cell. The bias circuit includes a p-type transistor electrically coupled in series with the selected memory cell of the memory array.

Other aspects and advantages of the present invention can be seen on review of the drawings, the detailed description, and the claims which follow.

DETAILED DESCRIPTION

A detailed description of embodiments of the present invention is provided with reference to the Figures.

Figure 1:
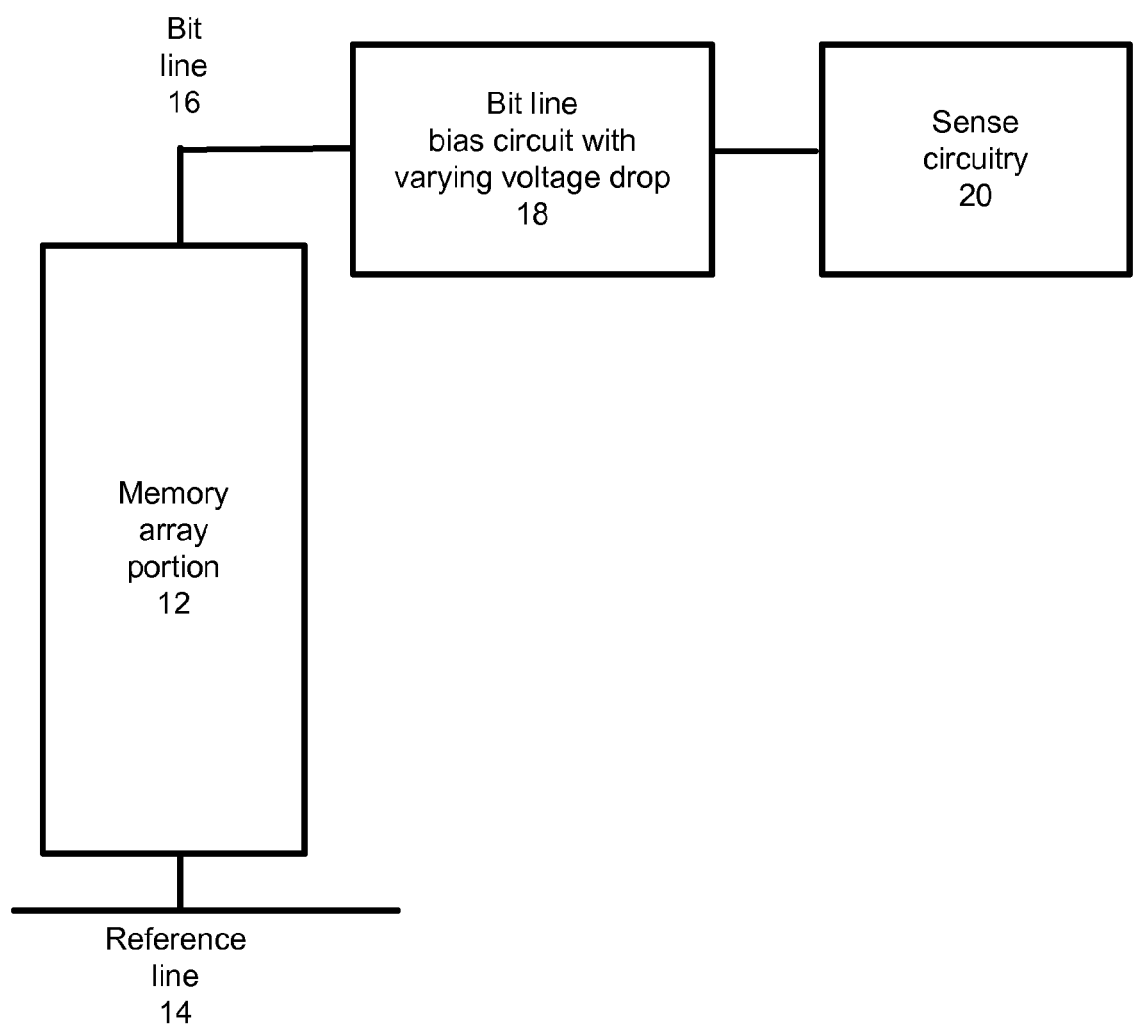
FIG. 1 is a block diagram of a memory architecture with a bit line bias circuit having a varying voltage drop.

FIG. 1 is a block diagram of a memory architecture with a bit line bias circuit having a varying voltage drop.

A memory array portion 12 is between a selected bit line 16 and a reference line 14. The memory array portion 12 can belong to a NAND array or a NOR array. The reference line 14 can be a source line with a reference voltage such as ground, that can be coupled to multiple bit lines in parallel, through multiple NAND strings or multiple NOR memory cells. The bit line bias circuit with varying voltage drop 18 applies a bit line bias to the bit line 16. The resulting voltage difference between the bit line 16 and the reference line 14 prepares conditions for a sense current to flow through the memory array portion 12, between the bit line 16 and the reference line 14. Memory cells in the memory array portion 12 have a threshold voltage representing stored data. A particular memory cell in the memory array portion 12 is selected to be read by a set of word lines and a set of bit lines including the bit line 16. Responsive to a word line voltage applied to the selected memory cell of the memory array portion 12, the sense current through the selected memory cell has a magnitude determined by the threshold voltage of the selected memory cell.

Based on the sense current flowing through the selected memory cell, the sense circuitry 20 ascertains the threshold voltage range which includes the threshold voltage of the selected memory cell, out of multiple threshold voltage ranges that represent different data values. Various embodiments of the sense circuitry 20 can perform sensing differently, such as by comparing the sense current against reference currents, or by comparing a sense voltage against reference voltages after allowing the sense current to flow to or from a capacitance.

Figure 2:
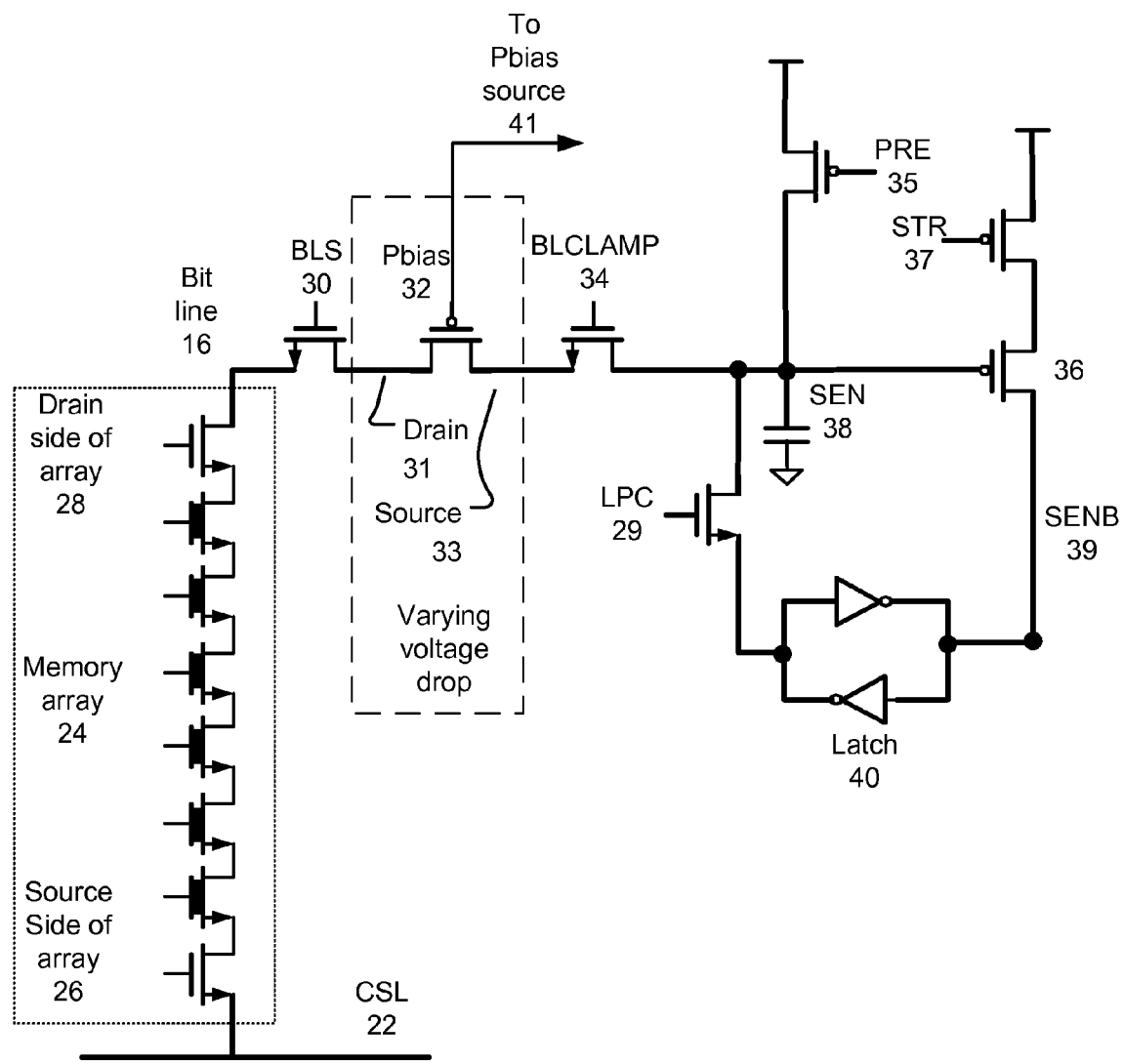
FIG. 2 is a circuit diagram with a more detailed example of a memory architecture with a bit line bias circuit having a varying voltage drop.

FIG. 2 is a circuit diagram with a more detailed example of a memory architecture with a bit line bias circuit having a varying voltage drop.

A precharge transistor PRE 35 precharges the sense capacitance SEN 38 to a precharge voltage. Bit line select transistor BLS 30 selects a particular bit line 16. The bit line 16 and the reference line, in this case, common source line CSL 22, are on opposite sides of a portion of the memory array 24. The memory array portion 24 has drain side 28 proximate to the bit line 16 and a source side 26 proximate to the common source line CSL 22, and the drain side 28 has a higher voltage than the source side 26 during sensing. A memory cell is selected for sensing by a combination of voltages applied by the bit line 16 selecting a column and a word line selecting a row out of a memory array. The selected memory cell has a threshold voltage representing data stored on the selected memory cell. The threshold voltage of the selected memory cell determines the sense current flowing through the selected memory cell, between the bit line 16 and the common source line CSL 22.

The bias of the bit line 16 is determined by the gate voltage of the bit line clamp transistor BLCLAMP 34, less the gate to source voltage of the bit line clamp transistor BLCLAMP 34, and less the source-to-drain voltage drop across Pbias transistor 32. The Pbias transistor 32 is a p-type transistor with a gate coupled to a Pbias source 41, a source 33 coupled to the source of the BLCLAMP transistor 34, and a drain 31 coupled to the drain of the BLS transistor 30.

The resistance of the Pbias transistor 32 is equal to the voltage drop between the source 33 and the drain 31 of the Pbias transistor 32, divided by the sense current flowing between the source 33 and the drain 31 of the Pbias transistor 32. The varying voltage drop of the Pbias transistor 32 is described as follows. The current-voltage characteristic of the Pbias transistor 32 is largely determined by the source-to-gate voltage of the Pbias transistor 32. The current-voltage characteristic of the Pbias transistor 32 has a hockey stick shape, having a linear mode with a substantially straight shape from the origin until the current saturates, and then a saturation mode with a largely constant current. In the linear mode, the Pbias transistor 32 behaves much like a constant resistance between the source and drain of the Pbias transistor 32. However, as the sense current through the Pbias transistor 32 increases, Pbias transistor 32 operates further away from linear mode and further into saturation mode, and the resistance across the source and drain of the Pbias transistor 32 increases beyond the resistance in linear mode. Because of this increasing resistance, a small increase in the sense current results in a relatively large voltage difference between the source 33 and the drain 31 of the Pbias transistor 32. Because the voltage of the source 33 of the Pbias transistor 32 is fixed, due to the relatively large voltage difference between the source 33 and the drain 31, the bias of the bit line 16 decreases relatively quickly with increasing sense current.

Typically, when a selected memory cell with a small threshold voltage is sensed, the sense current is large. However, the varying voltage drop of the Pbias transistor 32 quickly lowers the bias of the bit line 16 with increasing sense current, and decreases the maximum sense current which can flow. Accordingly, even when a selected memory cell with a small threshold voltage is sensed, the sense current is clamped.

Sensing occurs over a predefined period given by the duration during which the selected memory cell current is allowed to discharge the capacitance SEN 38. The lower the threshold voltage and the more conductive the selected memory cell, the faster the discharge of the capacitance SEN 38. The higher the threshold voltage and the less conductive the selected memory cell, the slower the discharge of the capacitance SEN 38. At the end of the predefined sensing period, the capacitance SEN 38 has a remaining voltage indicative of the threshold voltage and hence the data stored on the selected memory cell.

The voltage of the capacitance SEN 38 is applied to the gate of p-type transistor 36. After the sensing period, when transistor STR 37 is on, the remaining voltage of the capacitance SEN 38 may or may not turn on the p-type transistor 36. If the p-type transistor 36 turns on, then the capacitance SEN 38 has discharged below (Vdd—threshold voltage of p-type transistor 36), such that the sense current is ascertained to be large. If the p-type transistor 36 does not turn on, then the sense current is ascertained to be small.

If the remaining voltage of capacitance SEN 38 has not dropped sufficiently low to turn on the p-type transistor 36, node SENB 39 at the drain side of the p-type transistor 36 remains low, and ground is latched in latch 40. However, if the remaining voltage of capacitance SEN 38 has dropped sufficiently to turn on the p-type transistor 36, then node SENB 39 is pulled up to Vdd, and Vdd is latched in latch 40. The transistor LPC 29 couples the latch 40 to capacitance SEN 38, and can pass values to the capacitance SEN 38.

Figure 3:
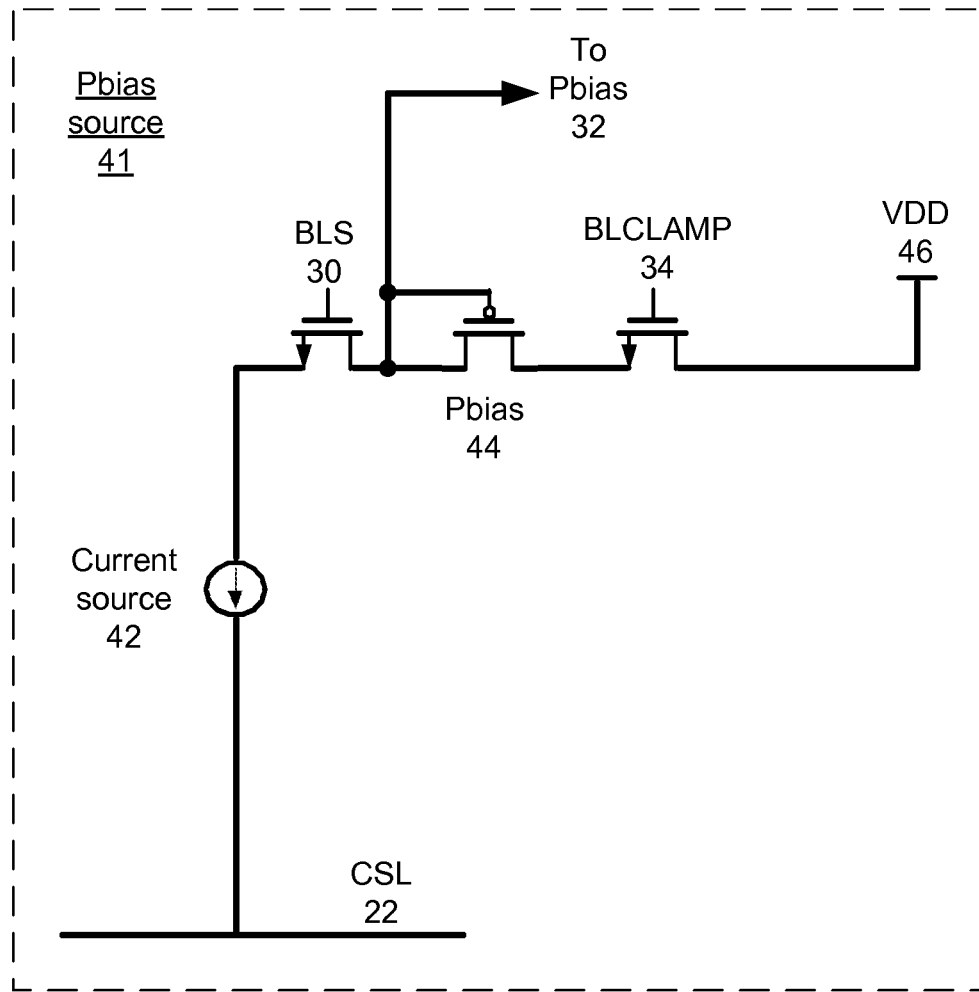
FIG. 3 is a circuit diagram of an example of a voltage source circuit for the varying voltage drop circuit element.

FIG. 3 is a circuit diagram of an example of a voltage source circuit for the varying voltage drop circuit element. The voltage source circuit has several circuit elements similar to the circuit of FIG. 2.

The Pbias source 41 determines the gate voltage of the Pbias transistor 32 in FIG. 2. A current source 42 is connected between the reference line, in this example common source line CSL 22, and the source of transistor BLS 30. The value of the current source 42 depends on the particular memory fabrication process and particular memory architecture. P-type Pbias transistor 44 has a gate and a drain coupled together an coupled to the drain of transistor BLS 30, and also providing the gate voltage of transistor Pbias 32. Transistor BLCLAMP 34 has a source coupled to the source of transistor Pbias 44, and a drain coupled to VDD 46.

Figure 4:
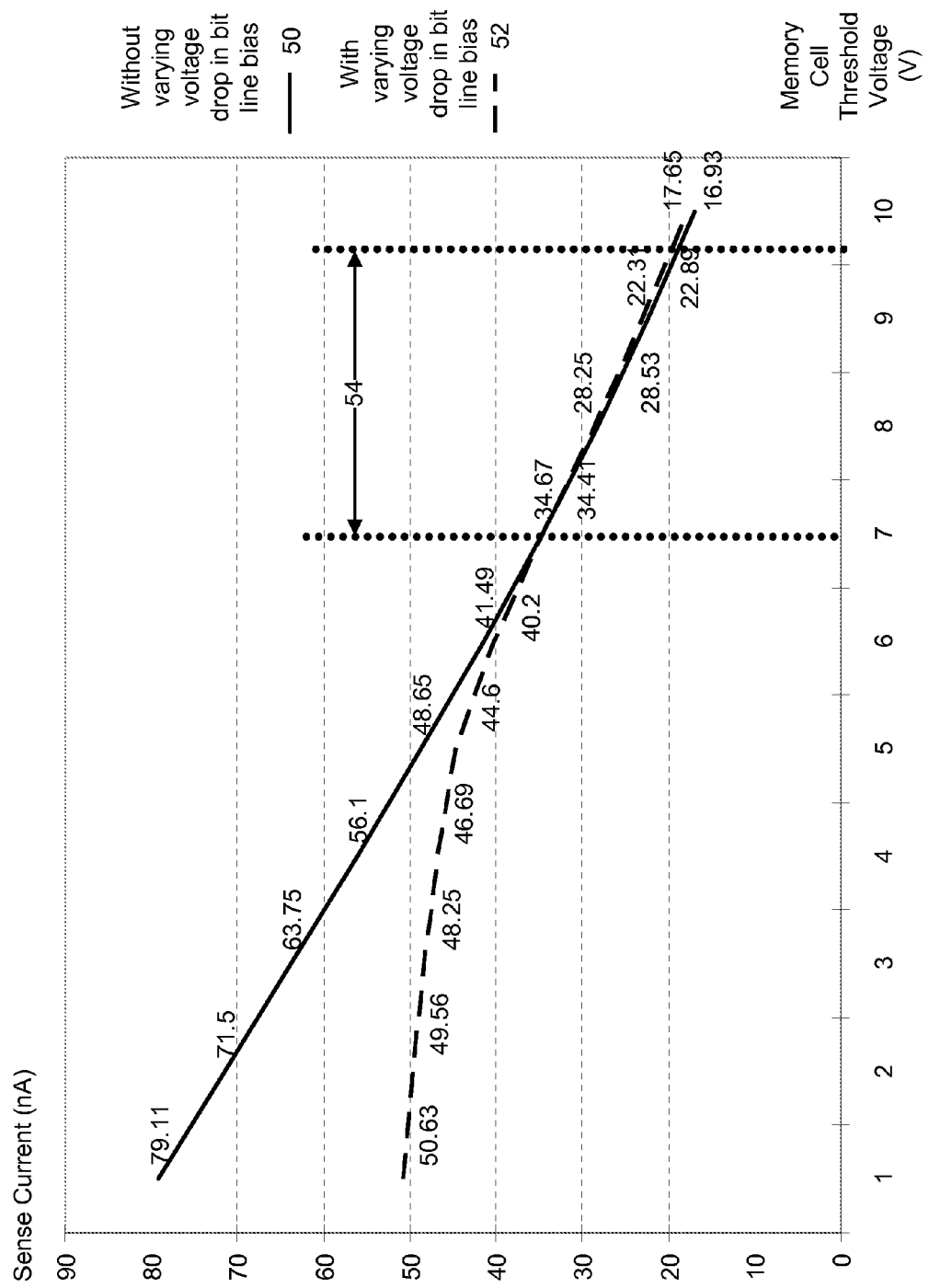
FIG. 4 is a graph of the sense current through a memory cell versus threshold voltage of the memory cell, with and without a varying voltage drop in the bit line bias circuit.

FIG. 4 is a graph of the sense current through a memory cell versus threshold voltage of the memory cell, with and without a varying voltage drop in the bit line bias circuit.

The solid trace 50 graphs the sense current through a memory cell versus threshold voltage of the memory cell, without a varying voltage drop in the bit line bias circuit. The graph is substantially linear with negative slope. The sense current rises from a low value of 16.93 nA through a memory cell with a threshold voltage of 10 V, to a high value of 79.11 nA through a memory cell with a threshold voltage of 1 V.

The dashed trace 52 graphs the sense current through a memory cell versus threshold voltage of the memory cell, with a varying voltage drop in the bit line bias circuit. The graph is substantially linear with negative slope for high threshold voltage memory cells, and the graph saturates for low threshold voltage memory cells. In the linear portion, the sense current rises from a low value of 17.65 nA through a memory cell with a threshold voltage of 10 V, to a medium value of 34.67 nA through a memory cell with a threshold voltage of 7 V. As the threshold voltage of the memory cell decreases further, the sense current rises less and less, and a sense current of 50.63 nA flows through a memory cell with a threshold voltage of 1V. The dashed trace 52 shows that the circuit element has a lower resistance as shown by a relatively large magnitude slope (delta I/delta V, inverse of resistance relationship) when sensing high threshold voltage cells in the linear portion of the dashed trace 52; and that the circuit element has a higher resistance as shown by a relatively small magnitude slope (delta I/delta V, inverse of resistance relationship) when sensing low threshold voltage cells in the saturated portion of the dashed trace 52. Accordingly, the dashed trace 52 shows that the circuit element has a lower resistance when sensing a memory cell with a threshold voltage in a high threshold voltage range, and that the circuit element has a higher resistance when sensing a memory cell with a threshold voltage in a low threshold voltage range.

Window 54 shows a linear portion of the graphs 50 and 52 of sense current versus threshold voltage of the memory cell. Narrowing of the sense current window, resulting from the varying voltage drop in the bit line bias circuit, is minimal for this window 54. The sense current window is affected if the window is widened to include the saturated portion of the graph 52.

Figure 5:
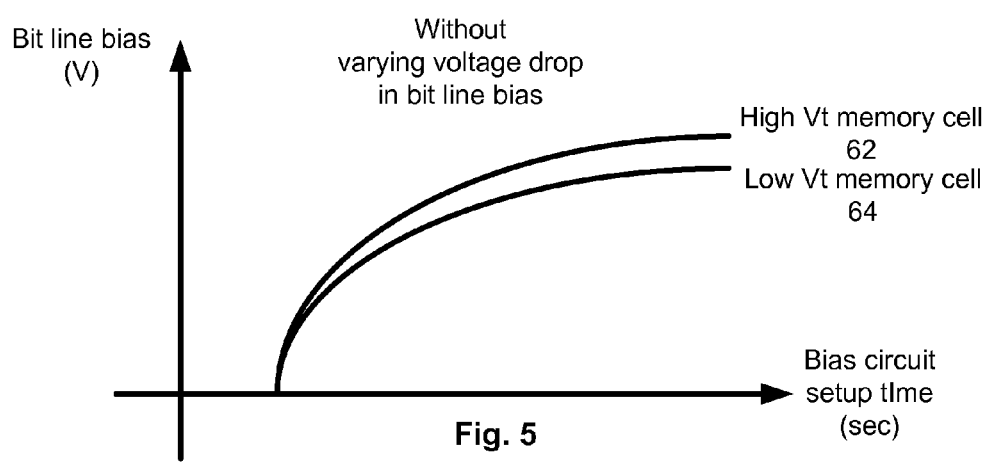
FIGS. 5 and 6 are graphs of the bit line bias versus the setup time of the bit line bias, contrasting the bit line biases with and without a varying voltage drop in the bit line bias circuit.
Figure 6:
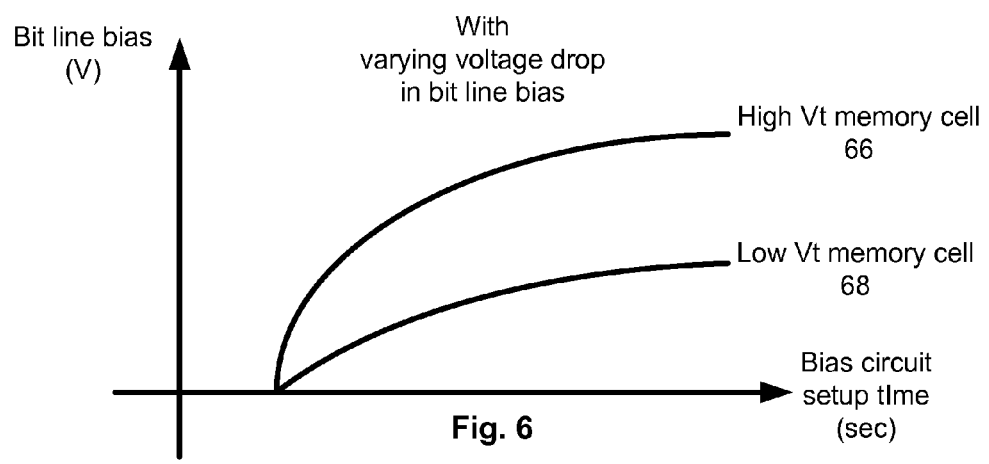

FIGS. 5 and 6 are graphs of the bit line bias versus the setup time of the bit line bias, contrasting the bit line biases with and without a varying voltage drop in the bit line bias circuit.

FIG. 5 shows graphs of the bit line bias versus bias circuit setup time, without a varying voltage drop in the bit line bias circuit. Trace 62 shows a high threshold voltage memory cell, associated with small sense current. Trace 64 shows a low threshold voltage memory cell, associated with large sense current. Trace 64 for a low threshold voltage memory cell is associated with slightly less bit line bias than trace 62 for a high threshold voltage memory cell. This difference indicates that the bit line bias circuit includes at least one circuit element with a voltage difference that increases slightly with increased sense current. However, this voltage difference is relatively small, and the difference between traces 62 and 64 is relatively small.

FIG. 6 shows graphs of the bit line bias versus bias circuit setup time, with a varying voltage drop in the bit line bias circuit. Trace 66 shows a high threshold voltage memory cell, associated with small sense current. Trace 68 shows a low threshold voltage memory cell, associated with large sense current. Trace 68 for a low threshold voltage memory cell is associated with significantly less bit line bias than trace 66 for a high threshold voltage memory cell. This difference indicates that the bit line bias circuit includes at least one circuit element with a varying voltage drop that increases with sense current. Accordingly, the difference between traces 66 and 68 is relatively large.

Figure 7:
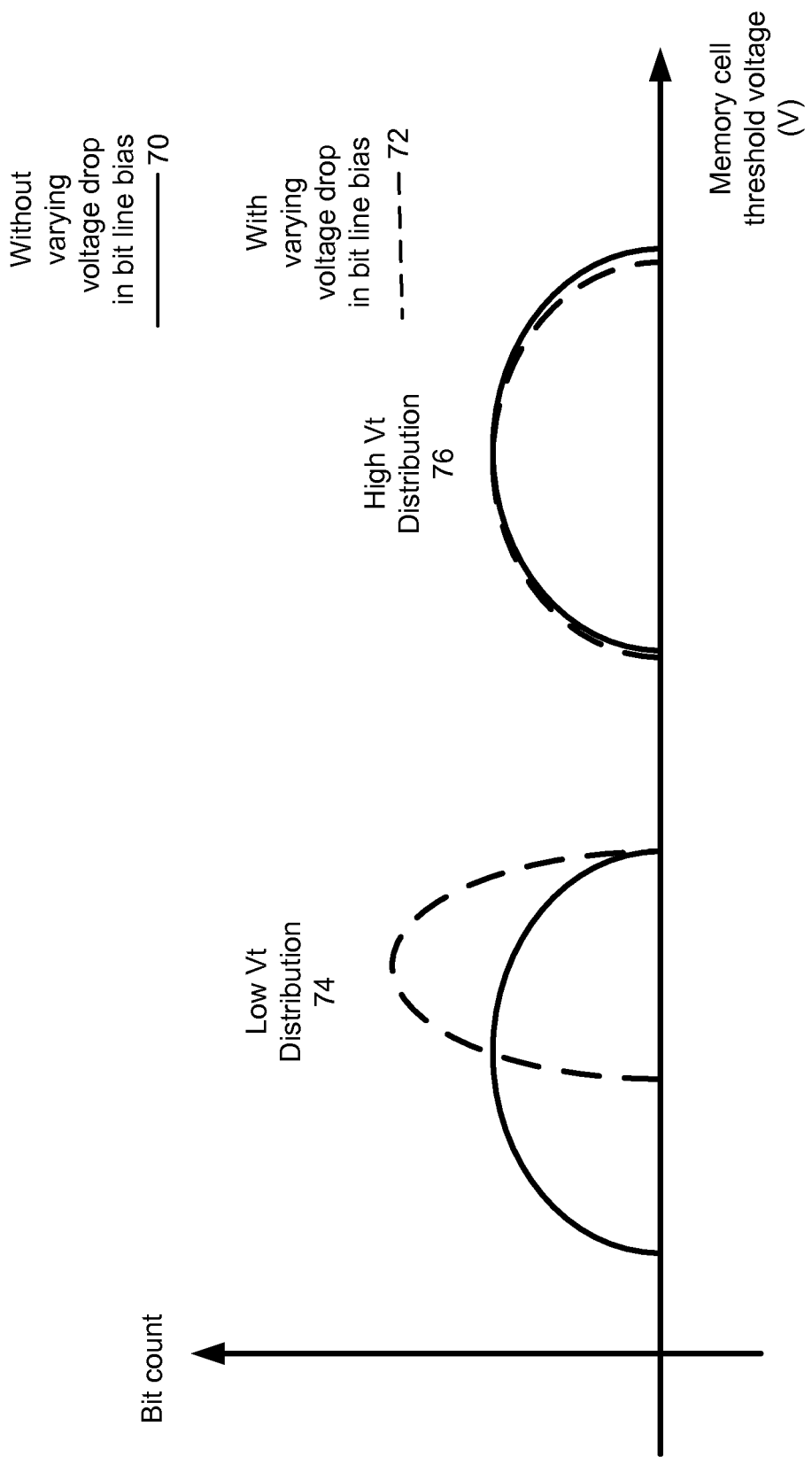
FIG. 7 is a graph of the bit count versus memory cell threshold voltage, with and without a varying voltage drop in the bit line bias circuit.

FIG. 7 is a graph of the bit count versus memory cell threshold voltage, with and without a varying voltage drop in the bit line bias circuit. The graph shows memory cells distributed among a low threshold voltage distribution 74 and a high threshold voltage distribution 76.

The high threshold voltage distribution 76 includes two traces—a solid trace corresponding to no varying voltage drop in the bit line bias circuit 70, and a dashed trace corresponding to a varying voltage drop in the bit line bias circuit bias circuit 72. For the circuit with a varying voltage drop in the bit line bias circuit bias circuit, the resistance remains substantially constant for low sense currents, which is behavior similar to the circuit without a varying voltage drop in the bit line bias circuit bias circuit. Accordingly, the two traces 70 and 72 are substantially identical at the high threshold voltage distribution 76.

The low threshold voltage distribution 74 includes two traces—a solid trace corresponding to no varying voltage drop in the bit line bias circuit 70, and a dashed trace corresponding to a varying voltage drop in the bit line bias circuit bias circuit 72. For the circuit with a varying voltage drop in the bit line bias circuit bias circuit, the varying voltage drop increases for high sense currents. Accordingly, the trace 72 is narrowed into the higher threshold portion of the low threshold voltage distribution 74. The trace 72 eliminates the lower threshold portion of the low threshold voltage distribution 74, because the varying voltage drop in the bit line bias circuit bias circuit prevents the associated high sense currents. The varying voltage drop causes the sense current to saturate, preventing sense currents that would otherwise flow for the memory cells with such low threshold voltages.

Figure 8:
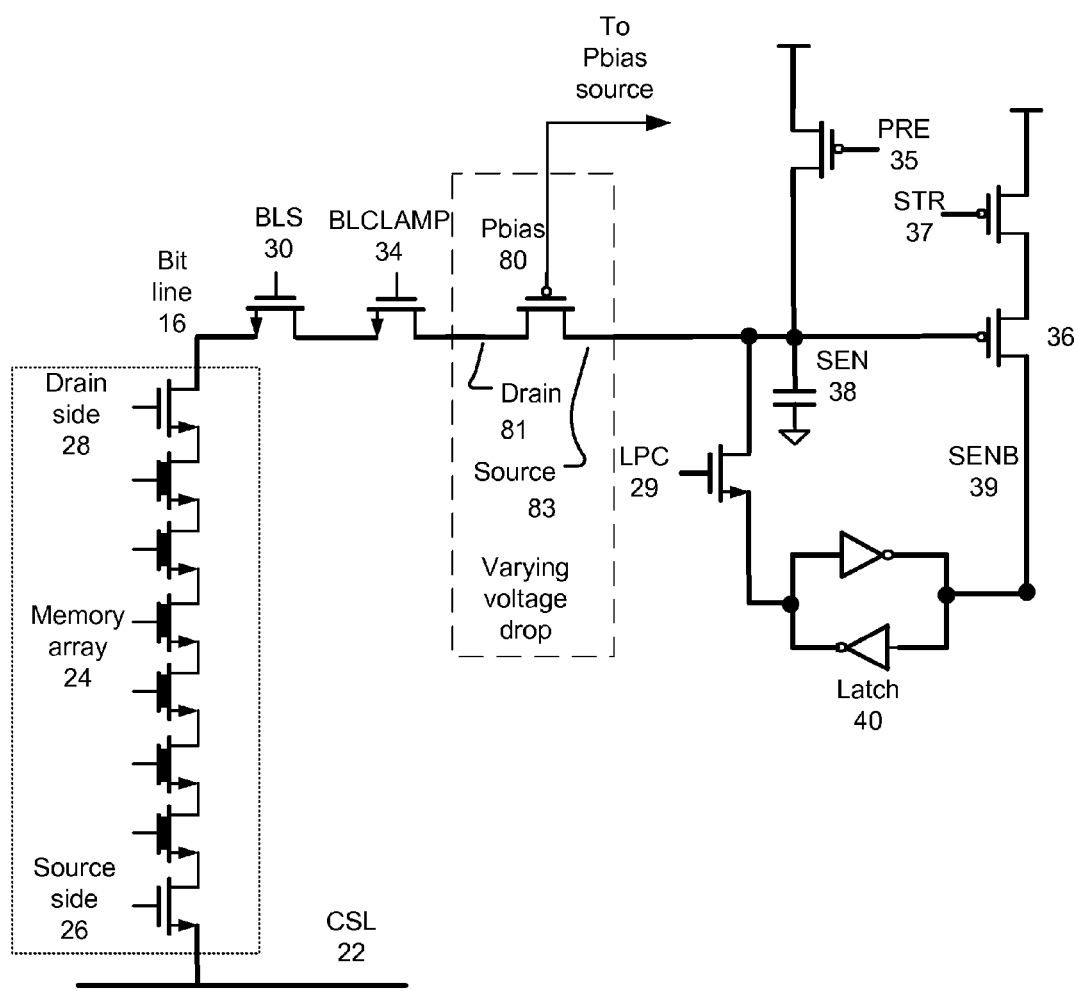
FIG. 8 is a block diagram of an alternative implementation of a memory architecture with a bit line bias circuit having a varying voltage drop.

FIG. 8 is a block diagram of an alternative implementation of a memory architecture with a bit line bias circuit having a varying voltage drop.

The circuit of FIG. 8 is largely similar to the circuit of FIG. 2. However, the varying voltage drop circuit element, the p-type transistor Pbias 80, is coupled to the drain of the transistor BLCLAMP 34. The p-type transistor Pbias 80 has a drain 81 coupled to the drain of the transistor BLCLAMP 34, a source 83 coupled to the sense capacitance SEN 38, and a gate coupled to Pbias source. An example Pbias source is shown by the Pbias source 41 of FIG. 3, but with interchanged positions for the transistor Pbias 44 and the transistor BLCLAMP 34. The drain of the transistor BLCLAMP 34 is controlled by the p-type transistor Pbias 80, so the clamp bias of the bit line 16 is also controlled by the p-type transistor Pbias 80.

Figure 9:
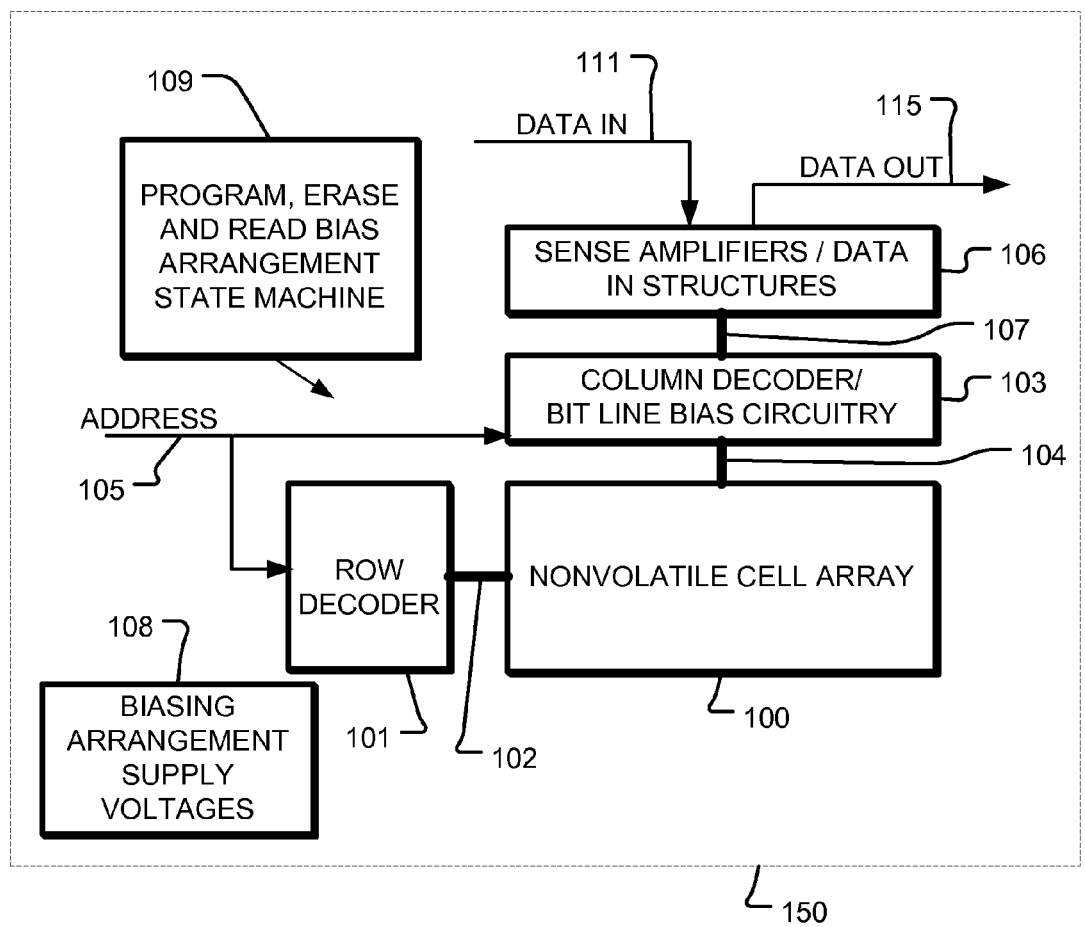
FIG. 9 is a block diagram of an integrated circuit with a memory array and a bit line bias circuit having a varying voltage drop.

FIG. 9 is a block diagram of an integrated circuit with a memory array and a bit line bias circuit having a varying voltage drop.

An integrated circuit 150 includes a memory array 100. A word line (or row) and block select decoder 101 is coupled to, and in electrical communication with, a plurality of word lines 102, and arranged along rows in the memory array 100. A bit line (column) decoder and bit line bias circuitry (with varying voltage drop circuit element) 103 are coupled to and in electrical communication with a plurality of bit lines 104 arranged along columns in the memory array 100 for reading data from, and writing data to, the memory cells in the memory array 100. Addresses are supplied on bus 105 to the word line decoder and drivers 101 and to the bit line decoder 103. Sense amplifiers and data-in structures in block 106, are coupled to the bit line decoder and bias circuitry 103 via the bus 107. Data is supplied via the data-in line 111 from input/output ports on the integrated circuit 150, to the data-in structures in block 106. Data is supplied via the data-out line 115 from the sense amplifiers in block 106 to input/output ports on the integrated circuit 150, or to other data destinations internal or external to the integrated circuit 150. Program, erase, and read bias arrangement state machine circuitry 109 controls biasing arrangement supply voltages 108.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
   a memory array with memory cells having a threshold voltage within one of a plurality of threshold voltage ranges representing data values storable in the memory cells, the memory cells having a drain side and a source side;
   a bias circuit that applies a bias to the drain side of a selected memory cell of the memory array during sensing of the threshold voltage of the selected memory cell, the bias circuit including a circuit element electrically coupled in series with the selected memory cell of the memory array, the circuit element having a varying voltage drop.

2. The integrated circuit of claim 1, wherein the drain side has a higher voltage than the source side during at least part of a sensing operation for the threshold voltage.

3. The integrated circuit of claim 1, wherein the varying voltage drop has a first voltage drop responsive to the threshold voltage of the selected memory cell being in a first threshold voltage range, and the varying voltage drop having a second voltage drop with a magnitude lower than the first voltage drop responsive to the threshold voltage of the selected memory cell being in a second threshold voltage range different from the first threshold voltage range.

4. The integrated circuit of claim 1, wherein the varying voltage drop increases with a decreasing magnitude of the threshold voltage of the selected memory cell.

5. The integrated circuit of claim 1, wherein the varying voltage drop increases with an increasing magnitude of a sense current flowing through the selected memory cell and the circuit element, during sensing of the threshold voltage of the selected memory cell.

6. The integrated circuit of claim 1, wherein the circuit element has a varying resistance equal to the voltage drop across first and second terminals of the circuit element divided by a sense current through the first and second terminals of the circuit element during sensing of the threshold voltage of the selected memory cell.

7. The integrated circuit of claim 1, further comprising:
   control circuitry coupled to the memory array, the control circuitry responsive to an instruction to read the selected memory cell, by causing the bias circuit to apply the bias to the drain side of the selected memory cell.

8. The integrated circuit of claim 1, wherein the circuit element is a transistor with a first current carrying terminal, a second current carrying terminal, and a control terminal, wherein the first current carrying terminal and the second current carrying terminal are electrically coupled in series with the selected memory cell.

9. The integrated circuit of claim 1, wherein the circuit element is a transistor with current-voltage operation modes including a linear mode and a saturation mode, and the varying voltage drop of the transistor increases as the transistor is biased further into the saturation mode and further away from the linear mode.

10. The integrated circuit of claim 1, further comprising:
   sense circuitry coupled to the bias circuit that identifies a threshold voltage range of the plurality of threshold voltage ranges that includes the threshold voltage of the selected memory cell.

11. An integrated circuit, comprising:
   a memory array with memory cells having a threshold voltage within one of a plurality of threshold voltage ranges representing data values storable in the memory cells;

a circuit element having a varying voltage drop that depends on a sense current flowing through a selected memory cell of the memory array and the circuit element, the sense current depending on the threshold voltage of the selected memory cell.

12. The integrated circuit of claim 11, wherein the varying voltage drop has a first voltage drop responsive to the threshold voltage of the selected memory cell being in a first threshold voltage range, and the varying voltage drop has a second voltage drop with a magnitude lower than the first voltage drop responsive to the threshold voltage of the selected memory cell being in a second threshold voltage range different from the first threshold voltage range.

13. The integrated circuit of claim 11, wherein the varying voltage drop increases with a decreasing magnitude of the threshold voltage of the selected memory cell.

14. The integrated circuit of claim 11, wherein the varying voltage drop increases with an increasing magnitude of the sense current flowing through the selected memory cell and the circuit element.

15. The integrated circuit of claim 11, wherein the circuit element has a varying resistance equal to the voltage drop across first and second terminals of the circuit element divided by the sense current through the first and second terminals of the circuit element.

16. The integrated circuit of claim 11, further comprising:
control circuitry coupled to the memory array, the control circuitry responsive to an instruction to read the selected memory cell, by causing the sense current to flow through the selected memory cell and the circuit element.

17. The integrated circuit of claim 11, wherein the circuit element is a transistor with a first current carrying terminal, a second current carrying terminal, and a control terminal, wherein the sense current flows through the first current carrying terminal and the second current carrying terminal.

18. The integrated circuit of claim 11, wherein the circuit element is a transistor with current-voltage operation modes including a linear mode and a saturation mode, and the varying voltage drop of the transistor increases as the transistor is biased further into the saturation mode and further away from the linear mode.

19. The integrated circuit of claim 11, further comprising:
sense circuitry responsive to the sense current through the selected memory cell, by identifying a threshold voltage range of the plurality of threshold voltage ranges that includes the threshold voltage of the selected memory cell.

20. An integrated circuit, comprising:
a memory array with memory cells having a threshold voltage within one of a plurality of threshold voltage ranges representing data values storable in the memory cells, the memory cells having a drain side and a source side;
a bias circuit with an output voltage that applies a bias to the drain side of a selected memory cell of the memory array during sensing of the threshold voltage of the selected memory cell, the bias circuit including:
a p-type transistor electrically coupled in series with the selected memory cell of the memory array.

21. The integrated circuit of claim 20, wherein the drain side of the memory cells having a higher voltage than the source side of the memory cells during sensing of the threshold voltage.

22. The integrated circuit of claim 20, wherein the bias circuit further includes a voltage reference, and a voltage drop from the voltage reference to the output voltage of the bias circuit depends on a varying voltage drop of the p-type transistor, the varying voltage drop of the p-type transistor increasing with a decreasing magnitude of the threshold voltage of the selected memory cell.

23. The integrated circuit of claim 20, wherein the bias circuit further includes a voltage reference, and a voltage drop from the voltage reference to the output voltage of the bias circuit depends on a varying voltage drop of the p-type transistor, the varying voltage drop of the p-type transistor increasing with an increasing magnitude of a sense current through the selected memory cell.

24. The integrated circuit of claim 20, wherein the p-type transistor has current-voltage operation modes including a linear mode and a saturation mode, and the varying voltage drop of the p-type transistor increases as the p-type transistor is biased further into the saturation mode and further away from the linear mode.

\* \* \* \* \*